(12) United States Patent
Tsai et al.

(10) Patent No.: US 6,787,918 B1
(45) Date of Patent: Sep. 7, 2004

(54) SUBSTRATE STRUCTURE OF FLIP CHIP PACKAGE

(75) Inventors: Ying-Chou Tsai, Taichung (TW); Han-Ping Pu, Taichung (TW); Shih-Kuang Chiu, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 5 days.

(21) Appl. No.: 09/586,525

(22) Filed: Jun. 2, 2000

(51) Int. Cl.⁷ .............................................. H01L 23/48
(52) U.S. Cl. .................. 257/778; 257/738; 257/779; 257/780
(58) Field of Search .................... 257/778–781, 257/738

(56) References Cited

U.S. PATENT DOCUMENTS

| | | | |
|---|---|---|---|
| 5,894,984 A | * | 4/1999 | Sakai et al. ............ 228/180.22 |
| 6,034,427 A | * | 3/2000 | Lan et al. .................... 257/698 |
| 6,108,212 A | * | 8/2000 | Lach et al. .................. 361/768 |
| 6,194,782 B1 | * | 2/2001 | Katchmar .................... 257/738 |
| 6,281,581 B1 | * | 8/2001 | Desai et al. ................. 257/737 |

FOREIGN PATENT DOCUMENTS

JP 2000-40764 * 2/2000 ........... H01L/23/12

* cited by examiner

Primary Examiner—Ori Nadav
(74) Attorney, Agent, or Firm—J.C. Patents

(57) ABSTRACT

A substrate structure of Flip Chip package includes a plurality of patterned circuit layers alternately stacking up with at least an insulative layer for isolating the patterned circuit layers. The patterned circuit layers are electrically connected each other wherein one of the patterned circuit layers is positioned on the surface of the substrate. The patterned circuit layer includes a plurality of first mounting pads and a plurality of second mounting pads. The solder mask layer covers the patterned circuit layer on the surface of the substrate, and a portion of the surface of the outer edge of the mounting pads while exposes a portion of the surface of the first mounting pads and the whole surface of the second mounting pads.

13 Claims, 4 Drawing Sheets

SUBSTRATE STRUCTURE OF FLIP CHIP PACKAGE

BACKGROUND OF THE INVENTION

1. Field of the Invention

This invention relates to a substrate structure of flip chip package, and more particularly to a substrate structure of flip chip package that can improve the bondability of the bump.

2. Description of Related Art

The Flip Chip technology being a package technology frequently applied in the CSP (Chip Scale Technology) can diminish the packaging area and shorten the path of signal transmission through the bump attachment to a carrier since the Flip Chip technology can employ area array for the disposition of bonding pads. In the current Flip Chip products, the contact area between the bump and the mounting pad can be changed, thereby, the collapse phenomenon will be affected depending on the extent of coverage of the solder mask over the mounting pad. The conventional mounting pad design can be classified into two categories, that is, SMD (Solder Mask Define) and NSMD (Non Solder Mask Define).

FIG. 1 shows the mounting pad structure of SMD according to a prior art. Most of the Flip Chip package employs laminating board as the substrate of the flip chip package wherein the laminating board is classified into two types, namely, the press type and the build-up type. As shown in FIG. 1, a laminating board 100 is mainly constituted by alternately stacking up a patterned circuit layer and an insulative layer 102. The patterned circuit layer is formed by the use of a copper foil layer for example, through the photolithographic and etching define, while the material for the insulative layer 102 includes "flame-retardant epoxy-glass fabric composite resin" (FR-4 FR-5), Bismaleimide-Taiazine (BT) or epoxy etc. A plurality of mounting pads 104 being formed on the exterior surface of the laminating board 100 is acted as connecting point between the laminating board 100 and the chip 110. In the SMD type of substrate, the solder mask layer 106 covers the patterned circuit layer on the exterior surface of the laminating board 100 while exposes only the outer edge portion of the mounting pad 104. A plurality of bonding pad is formed on the active surface 112 of the chip 110, and an UBM (Under Bump Metallurgy) layer 114 is formed on top of the bonding pad, and bumps 116 such as solder bumps are further formed on top of the UBM layer. The solder mask layer 106 and the size of the UBM layer 114 will limit the range of the collapse of the bumps 116. Therefore, the dimension of the pad w opening 108 of the solder mask layer 106 not only can determine the attaching area between the bumps 116 and the mounting pad 104 but also can affect the collapse phenomenon of the bumps 116 and the final height of the bumps 116.

FIG. 2 shows the mounting pad structure of NSMD according to a prior art. As shown in FIG. 1, in the NSMD structure, the solder mask layer 106a exposes completely the whole surface of the mounting pad 104a, and the bumps 116 attaches not only to the top surface 120 but also the side surfaces 122 of the mounting pad 104a. In this way, the contact area between the bump 116 and the mounting pad 104a is increased. At this moment, since a clearance is kept between the bump 116 and the pad opening 108a, thereby, the pad opening 108a of the solder mask layer 106a will neither affect the collapse phenomenon of the bump 116 nor the final height of the bump 116.

No matter whether it is a SMD or a NSMD structure type of bump pad design, there are merits and demerits in their application. As far as the substrate design of the flip chip package is concerned, the SMD design is relatively not easy to generate voids, thereby, the product yield can be improved in the subsequent underfilling process. This is because that there is no clearance between the bump and the solder mask layer after the bump is attached to the bump pad for the SMD design. But the collapse phenomenon of the SMD and the bondability (between the bump and the mounting pad) are poor, thereby, the demand for the coplanarity of the substrate of the flip chip package is relatively rigorous, and the process tolerance is relatively small. This is because that there is no clearance between the bump and the solder mask layer for the SMD design, thereby, the contact area between the bump and the mounting pad is relatively small.

On the contrary, as far as the NSMD design is concerned, since there is a clearance as between the bump and the pad opening, the contact area is relatively large as it includes the ones on the top and side surfaces. Therefore, the collapse phenomenon is relatively good, and the bondability is relatively robust, thus the tolerance for the coplanar error of the substrate of the flip chip package is relatively large. However, in order to avoid the generation of the void in the subsequent underfilling process, the pad opening of the solder mask layer needs to be enlarged properly. As a result, the pitch of the mounting pads needed to be increased to meet this requirement, thus the packaging density becomes lower, and this makes the layout work of the substrate of the flip chip package relatively difficult. Therefore, it is very important to design a mounting pad that has the merits of both the SMD and the NSMD design while has the least demerits of the SMD and the NSMD design.

In the current flip chip products, the layout of the bumps is mainly classified into a peripheral type and a full matrix type. But based on the limitation of the fabrication and design ability, the disposition of the contact points is limited. Take a build-up substrate of a flip chip package having six layers (2+2+2) of laminating board for example, the mounting pads for signal transmission can usually be disposed on the outer loops. While the power contact points, the ground contact points and the dummy contact points are disposed in the inner loop area. As the space available in the inner loop area is quite sufficient, it is quite flexible as far as the design is concerned, thereby, the pitch of the mounting pads in this area is relatively large.

SUMMARY OF THE INVENTION

Therefore, it is the one of the objectives of the present invention to provide a substrate structure of flip chip package having both the SMD and NSMD structure, and to improve manufacturing yield through an appropriate arrangement.

It is another objective of the present invention to provide a substrate structure of flip chip package that allows relatively large coplanar error of the bumps and the mounting pads, consequently, the manufacturing tolerance of the flip chip package is increased.

In order to attain the foregoing and other objectives, the present invention provides a substrate structure of Flip Chip package includes a plurality of patterned circuit layers alternately stacking up with at least an insulative layer for isolating the patterned circuit layers. The patterned circuit layers are electrically connected each other wherein one of the patterned circuit layers is positioned on the surface of the substrate. The patterned circuit layer includes a plurality of first mounting pads and a plurality of second mounting pads. The solder mask layer covers the patterned circuit layer on the surface of the substrate, and a portion of the surface of the outer edge of the mounting pads while exposes a portion of the surface of the first mounting pads and the whole surface of the second mounting pads.

According to a preferred embodiment of the present invention, a plurality of vias are disposed in the insulative layer for electrically connecting to the patterned circuit layers. And the pitch of the first mounting pads is smaller than the pitch of the second mounting pad. Also, the first mounting pads are disposed on the periphery region of the substrate of the flip chip package while the second mounting pads are disposed in the central region of the substrate of the flip chip package. Moreover, the bumps attach only to the top surface of the first mounting pads while attach to both the top surface and side surfaces of the second mounting pads.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
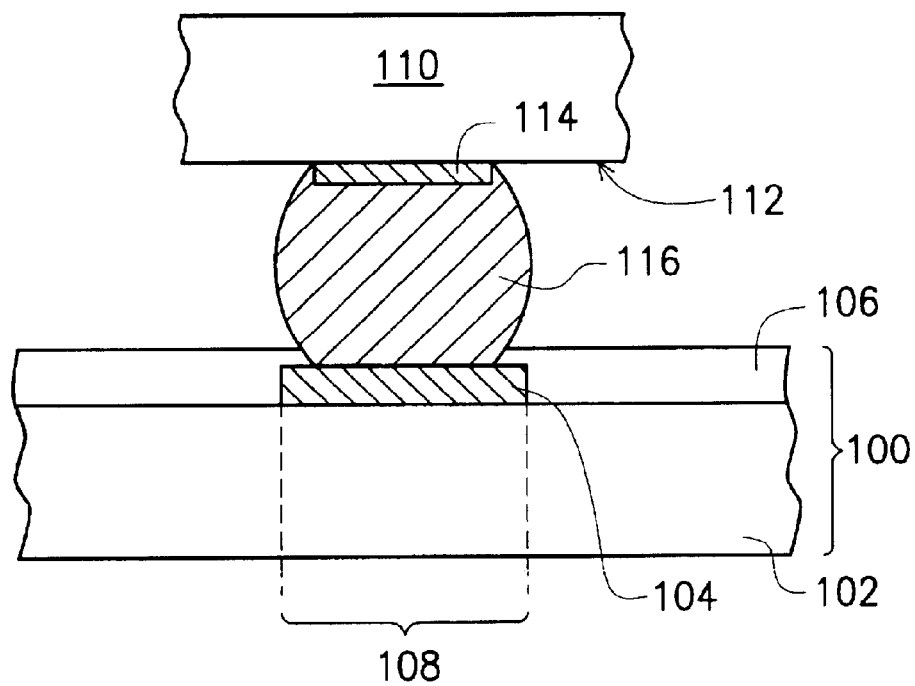
FIG. 1 shows a mounting pad structure of SMD according to a prior art.
Figure 2:
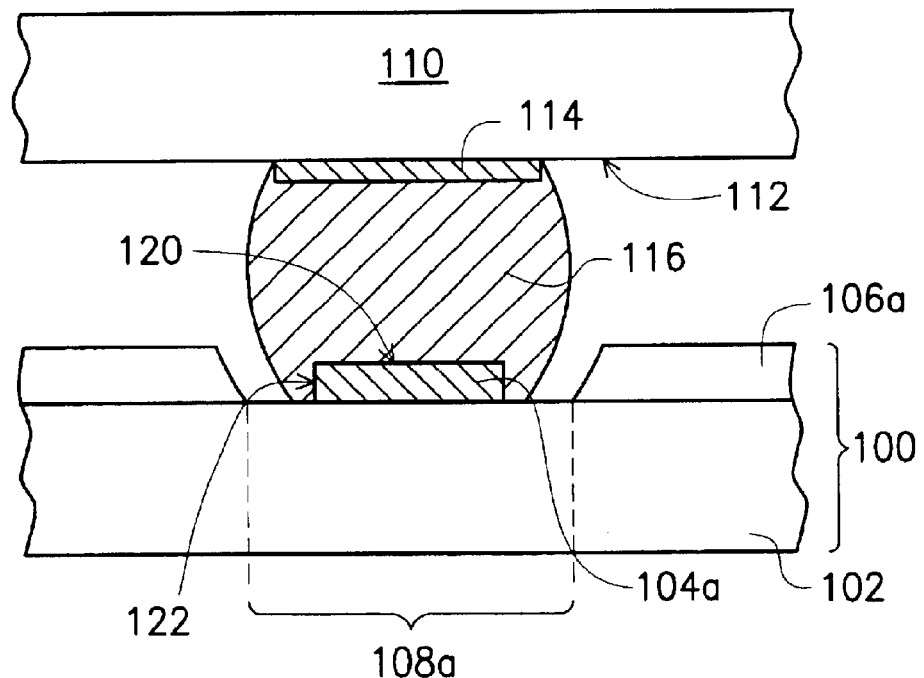
FIG. 2 shows a mounting pad structure of NSMD according to a prior art.
Figure 3:
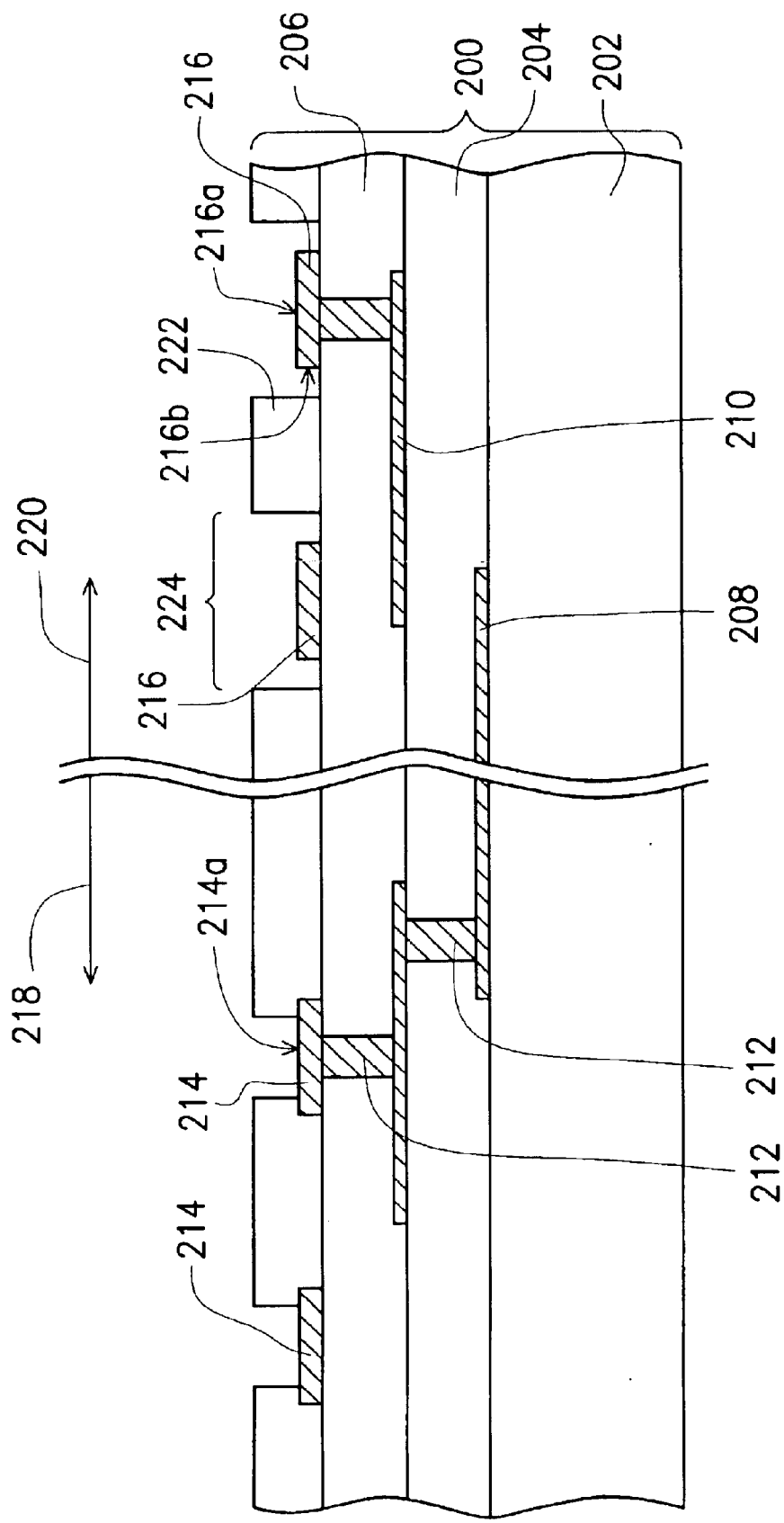
FIG. 3 shows a cross-sectional view of a substrate structure of a flip chip package according to a preferred embodiment of the present invention.
Figure 4:
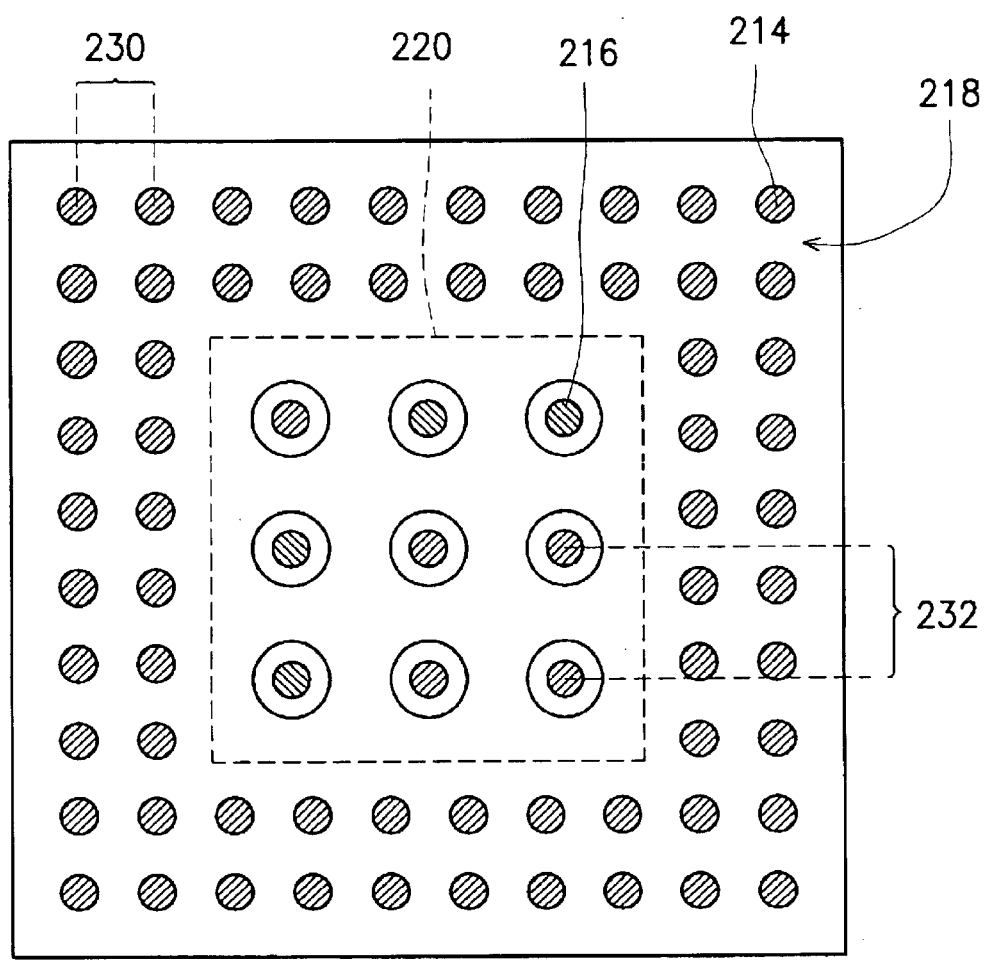
FIG. 4 shows a top view of a substrate structure of a flip chip package according to a preferred embodiment of the present invention.

FIG. 3 shows a cross-sectional view of a substrate structure of a flip chip package according to a preferred embodiment of the present invention, and FIG. 4 shows a top view of a substrate structure of a flip chip package according to a preferred embodiment of the present invention. As shown in FIG. 3 and FIG. 4, a substrate 200 of a flip chip package of the present invention is mainly constituted by alternately stacking up a multiplicity of insulative layers 202, 204, 206 and a multiplicity of patterned circuit layers 208, 210. Among them, the insulative layer 202 is an insulative layer that is made of "flame-retardant epoxy-glass fabric composite resin " or Bismaleimide-Taiazine (BT) etc. The material for the insulative layer 204, 206 is the one such as epoxy. The patterned circuit layer 208, 210 being made of copper foil and defined by photolithographic and etching processes forms electrical connection through a via 212 in the insulative layer 204, 206. The patterned circuit layer of the outward layer of the substrate 200 forms not only circuits but also a plurality of first mounting pads 214 and a plurality of second mounting pads 216 to be the contact points of the bumps. The first mounting pads 214 are disposed in the periphery region 218 of the substrate 200 while the second mounting pads 216 are disposed in the central region 220 of the substrate 200. The insulative layers 204 and 206, patterned circuit layer 210, and the patterned circuit layer of the outward layer can be formed by the build-up method.

The surface of the patterned circuit layer of the outward layer is coated with a solder mask layer 222 made of an insulative layer including ultra-violet type of solder mask and thermoset type of solder mask etc. Methods for forming the solder mask layer 222 include Roller Coating, Curtain Coating, Screen Printing, Dipping, and Dry Film method etc. As shown in FIG. 3, the solder mask layer 222 exposes only a portion of the top surface 214a of the first mounting pad 214 in the peripheral region 218. While for the central region 220, the solder mask layer 222 forms a pad opening 224, and exposes completely the top surface 216a and side surfaces 216b. Therefore, the peripheral region 218 belongs to the SMD mounting pad structure while the central region 220 belongs to the NSMD mounting pad structure. However, since the space in the central region 220 is relatively large, the disposition of the second mounting pads 216 can be relatively loose and flexible. The pitch 230 of the first mounting pads 214 is small than the pitch 232 of the second mounting pads 216 wherein the size of the pitches 230 is around 150 to 250 μm (micrometer).

Figure 5:
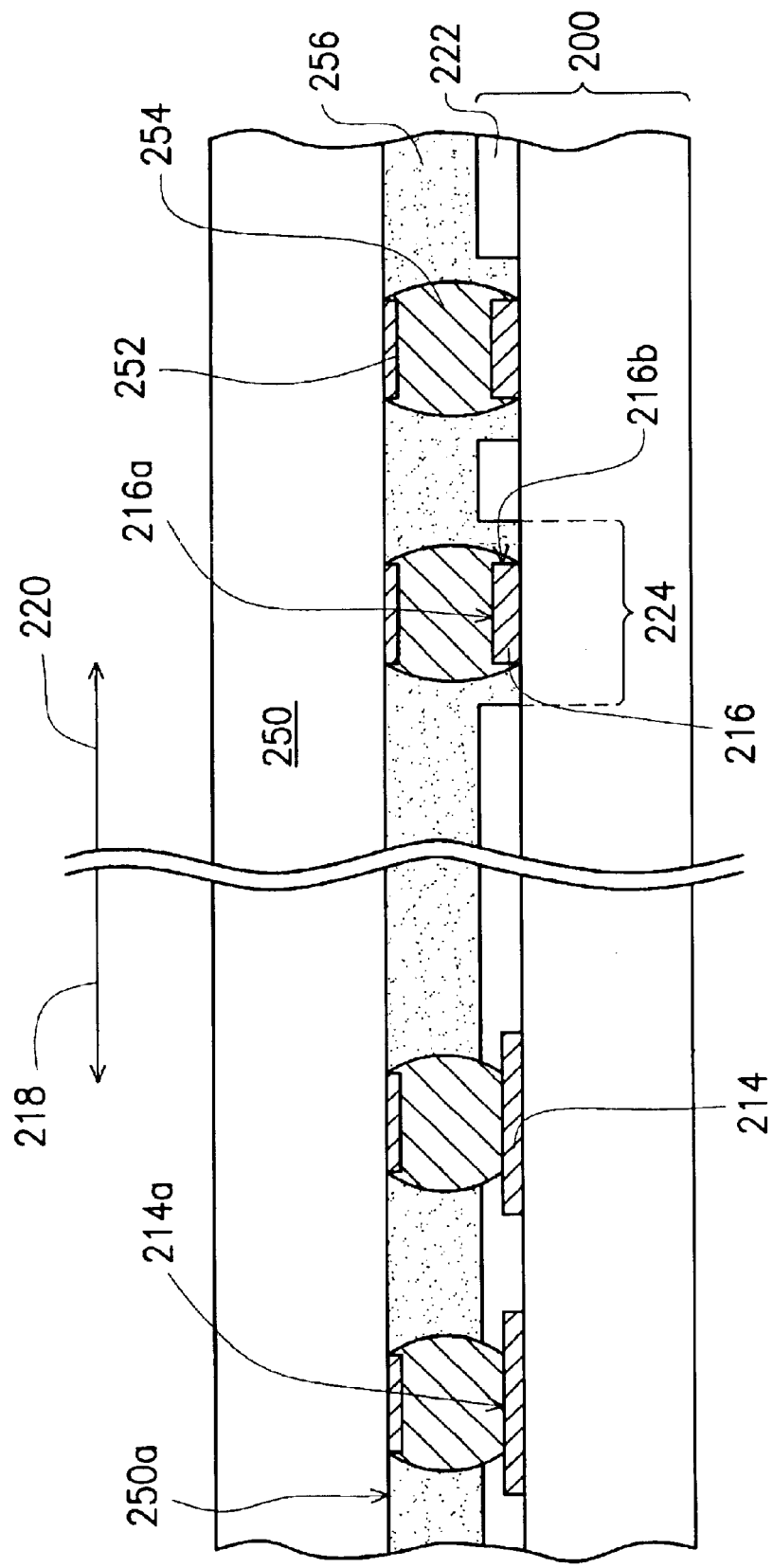
FIG. 5 shows a cross-sectional view of a flip chip package according to a preferred embodiment of the present invention.

FIG. 5 shows a cross-sectional view of a flip chip package according to a preferred embodiment of the present invention. Likewise, as shown in FIG. 5, as the substrate 200 is applied in the flip chip package of the present invention, the first mounting pad 214 of the peripheral region 218 is a SMD structure while the second mounting pad 216 of the central region 220 employs NSMD structure. The active surface 250a of the chip 250 has a multiplicity of bonding pads each disposes an UBM (under-bump metallurgy) layer 252 with a bump 254 formed thereon. The bumps are electrically connected to their corresponding first bonding pads 214 and second bonding pads 216. In the meantime, an underfill material 256 is filled in between the chip 250 and the substrate 200 to sustain the thermal stress generated. This generated thermal stress is due to the difference in thermal expansion of the chip 250 and the substrate 200. The filling of the underfill material 256 can improve the reliability of the bumps 254 in the flip chip package.

Since the substrate 200 of the flip chip package of the present invention employs SMD structure in the peripheral region 218, only a portion of the bumps 254 corresponding to the first mounting pads 214 can attach the top surface 214a of the mounting pads 214. And no void is appeared when it comes to fill the underfill material 256 since there is no clearance between the bumps and the solder mask, thereby, the yield can be improved. Moreover, since NSMD structure is employed in the central region 220, only another portion of the bump 254 corresponding to the second bonding pads 216 can attach the top surface 216a and side surfaces 216b of the second bonding pads 216. Since the central region 220 is relatively spacious, and the pitch of the second bonding pad 216 is relatively large, i.e., the pad opening is relatively large, thereby, no void will be appeared when it comes to fill the underfill material 256. Besides, the collapse phenomenon generated can be relatively significant since the bumps 254 attach not only the top surface 216a but also the side surfaces 216b. Therefore, the quality of bump-to-mounting pad attachment is improved. Consequently, when it comes to flip chip packaging, the tolerance of the coplanar error can be increased, thereby, the process yield is improved.

To summarize the foregoing illustration disclosed by preferred embodiments of the present invention, the substrate structure of flip chip package of the present invention includes the following advantages:
1. The substrate structure of flip chip package of the present invention employs a mixed SMD-and-NSMD type of mounting pad structure, and to have an appropriate disposition of the mounting pads such that the package can covers the merits and avoid the demerits of both the SMD and NSMD types of mounting pad structures, thereby, the process yield is improved.

2. The substrate structure of flip chip package of the present invention allows a relatively large tolerance of coplanar error for both the bumps and the mounting pads to avoid the generation of void in the filling portion having underfill material.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A substrate structure of Flip Chip package comprising:

a plurality of patterned circuit layers;

at least an insulative layer stacked between the patterned circuit layers for isolating the patterned circuit layers, and the patterned circuit layers are electrically connected one another, and one of the patterned circuit layer is positioned on the surface of the substrate of the flip chip package as a top patterned circuit layer, and the top patterned circuit layer comprises at least a plurality of first mounting pads and a plurality of second mounting pads; and a solder mask layer covering the patterned circuit layer on the surface of the substrate of the flip chip package, the solder mask layer partially covering a first top surface of the first mounting pads while entirely exposing a second top surface and sidewalls of the second mounting pads, wherein the first mounting pads are disposed at a peripheral region of the substrate and the second mounting pads are disposed at a central region of the substrate, and wherein said first and second mounting pads are directly attached to corresponding bumps of a chip.

2. The substrate structure of Flip Chip package of claim 1 wherein the material for the insulative layer is selected from the group consisting of flame-retardant epoxy-glass fabric composite resin, Bismaleimide-Trazine (BT), and epoxy.

3. The substrate structure of Flip Chip package of claim 1 wherein each of the patterned circuit layer is formed by a copper foil layer defined by photolithographic and etching processes.

4. The substrate structure of Flip Chip package of claim 1 wherein the pitch of the first mounting pads is smaller than the pitch of the second mounting pad.

5. The substrate structure of Flip Chip package of claim 1 wherein a plurality of vias are disposed in the insulative layer for electrically connecting to the patterned circuit layers.

6. A substrate structure of Flip Chip package comprising:

a plurality of patterned circuit layer;

at least an insulative layer stacked between the patterned circuit layers for isolating the patterned circuit layers, and the patterned circuit layers are electrically connected one another, and one of the patterned circuit layer is positioned on the surface of the substrate of the flip chip package as a top patterned circuit layer, and the top patterned circuit layer comprises at least a plurality of first mounting pads and a plurality of second mounting pads;

a solder mask layer covering the top patterned circuit layer on the surface of the substrate of the flip chip package, the solder mask layer partially covering a first top surface of the first mounting pads while entirely exposing a second top surface and sidewalls of the second mounting pads, wherein the first mounting pads surround the second mounting pads;

a chip having an active surface with a plurality of bumps disposed thereon wherein the chip has its active surface face to the surface of the substrate of the flip chip package, and the bumps are directly attached to their corresponding first bonding pads and second bonding pads respectively; and an underfill material filling between the active surface of the chip and the top surface of the substrate of the flip chip package.

7. The substrate structure of Flip Chip package of claim 6 wherein the material for the insulative layer is selected from the group consisting of flame-retardant epoxy-glass fabric composite resin, Bismaleimide-Triazine (BT), and epoxy.

8. The substrate structure of Flip Chip package of claim 6 wherein each of the patterned circuit layer is formed by a copper foil layer defined by photolithographic and etching processes.

9. The substrate structure of Flip Chip package of claim 6 wherein the pitch of the first mounting pads is smaller than the pitch of the second mounting pad.

10. The substrate structure of Flip Chip package of claim 6 wherein a plurality of vias are disposed in the insulative layer for electrically connecting to the patterned circuit layers.

11. The substrate structure of Flip Chip package of claim 6, wherein the first mounting pads are disposed on the periphery region of the substrate of the flip chip package while the second mounting pads are disposed in the central region of the substrate of the flip chip package.

12. The substrate structure of Flip Chip package of claim 6 wherein the bumps attach only to the top surface of the first mounting pads.

13. The substrate structure of Flip Chip package of claim 6 wherein the bumps attach to both the top surface and side surfaces of the second mounting pads.

* * * * *